(12) United States Patent
Ruiz Holguin et al.

(10) Patent No.: US 11,659,681 B2
(45) Date of Patent: May 23, 2023

(54) SEISMIC SHIMS FOR MODULAR DATACENTERS

(71) Applicant: Dell Products L.P., Round Rock, TX (US)

(72) Inventors: Luis Alejandro Ruiz Holguin, Round Rock, TX (US); Tony P. Middleton, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/505,792

(22) Filed: Oct. 20, 2021

(65) Prior Publication Data

US 2023/0122137 A1   Apr. 20, 2023

(51) Int. Cl.
  *H05K 7/14*   (2006.01)
  *H05K 7/18*   (2006.01)
  *E04B 1/98*   (2006.01)

(52) U.S. Cl.
  CPC ............ *H05K 7/1495* (2013.01); *H05K 7/18* (2013.01); *E04B 1/98* (2013.01)

(58) Field of Classification Search
  CPC .......... H05K 7/1495; H05K 7/18; E04B 1/98
  See application file for complete search history.

(56) References Cited

U.S. PATENT DOCUMENTS

| | | | | |
|---|---|---|---|---|
| 5,475,888 A | * | 12/1995 | Massey | B65G 69/2823 14/71.3 |
| 8,967,392 B1 | * | 3/2015 | Czamara | H05K 7/1488 248/638 |
| 10,412,854 B1 | * | 9/2019 | Shaul | H05K 7/1495 |
| 10,508,675 B2 | | 12/2019 | Wissling | |
| 2002/0189119 A1 | * | 12/2002 | High | B25H 7/04 33/613 |

OTHER PUBLICATIONS

American Society of Civil Engineers, "Minimum Design Loads for Buildings and Other Structures," ASCE Standard ASCE/SEI 7-10, 2010, 253 pages.

* cited by examiner

*Primary Examiner* — Mukundbhai G Patel
(74) *Attorney, Agent, or Firm* — Ryan, Mason & Lewis, LLP

(57) ABSTRACT

A seismic shim for electronic equipment comprises a base comprising at least a first hole through the base, wherein the first hole is configured to receive a first fastener, and an extension portion extending from the base. The extension portion is perpendicular to the base and comprises at least a second hole through the extension portion, wherein the second hole is configured to receive a second fastener. The seismic shim also comprises a first gusset and a second gusset disposed between the base and the extension portion. The second gusset is spaced apart from the first gusset. The seismic shim is configured for anchoring to an underlying floor structure via the first fastener inserted through the first hole, and is configured for attachment to a surface of the electronic equipment via the second fastener inserted through the second hole.

20 Claims, 7 Drawing Sheets

SEISMIC SHIMS FOR MODULAR DATACENTERS

FIELD

The field relates generally to electronic equipment, and more particularly to mounting structures for such electronic equipment.

BACKGROUND

Modular datacenters require seismic anchoring via concrete installation slabs in most jurisdictions in the United States. These anchor slabs are typically sloped to accommodate for site drainage, resulting in leveling challenges when installing modular data centers. Conventional seismic solutions for mounting equipment to slabs are complex, requiring, for example, cumbersome leveling techniques and onsite welding, which demands expensive skilled labor. Moreover, weld quality is an issue, as welds can exhibit various types of flaws and can deteriorate over time.

SUMMARY

Illustrative embodiments provide mounting solutions to address datacenter installation requirements.

In one embodiment, a seismic shim for electronic equipment comprises a base comprising at least a first hole through the base, wherein the first hole is configured to receive a first fastener, and an extension portion extending from the base. The extension portion is perpendicular to the base and comprises at least a second hole through the extension portion, wherein the second hole is configured to receive a second fastener. The seismic shim also comprises a first gusset and a second gusset disposed between the base and the extension portion. The second gusset is spaced apart from the first gusset. The seismic shim is configured for anchoring to an underlying floor structure via the first fastener inserted through the first hole, and is configured for attachment to a surface of the electronic equipment via the second fastener inserted through the second hole.

Such an arrangement advantageously provides an easily deployed design that satisfies both seismic anchoring and datacenter leveling installation requirements without complex installation procedures.

Moreover, illustrative embodiments provide for flexible installation, whereby individual shims can be strategically located to align with critical load points of installed equipment and can be added or removed to accommodate various manufacturing tolerances of installation sites and installed modules.

These and other embodiments include, without limitation, apparatus, systems and methods. For example, an exemplary apparatus or system in another embodiment illustratively comprises a modular datacenter having one or more mounting shims attached thereto.

DETAILED DESCRIPTION

Illustrative embodiments will be described herein with reference to exemplary seismic mounting shim and leveling shim configurations for electronic equipment such as modular datacenters. It is to be appreciated, however, that the embodiments are not restricted to the particular illustrative configurations shown. Terms such as "modular datacenter" as used herein are intended to be broadly construed, so as to encompass, for example, a wide variety of arrangements of storage drives, processors, servers or other types of computer components and electronic equipment, which may be arranged in a common housing for electronic equipment, such as, but not necessarily limited to, a chassis, frame or rack.

Figure 1:
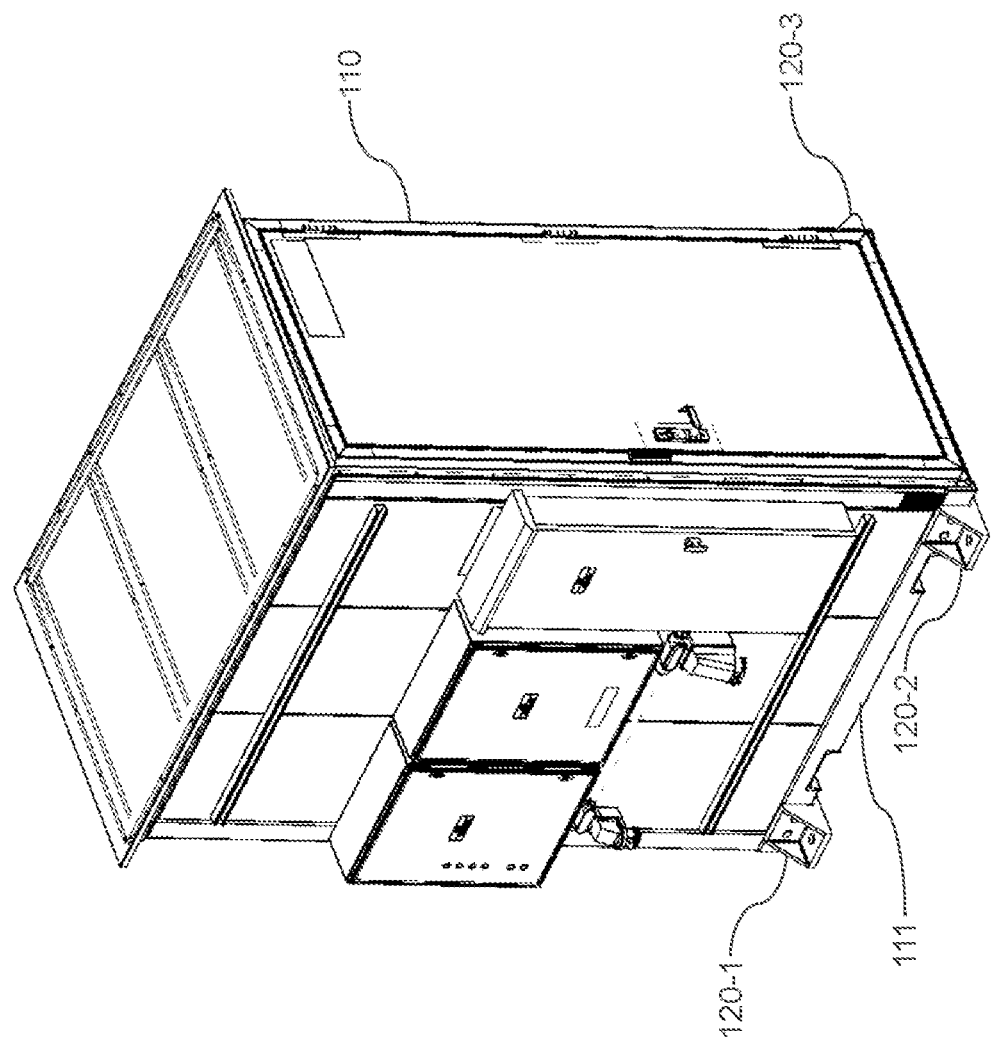
FIG. 1 shows a perspective view of a modular datacenter including a plurality of seismic mounting shims attached thereto in an illustrative embodiment.
Figure 2:
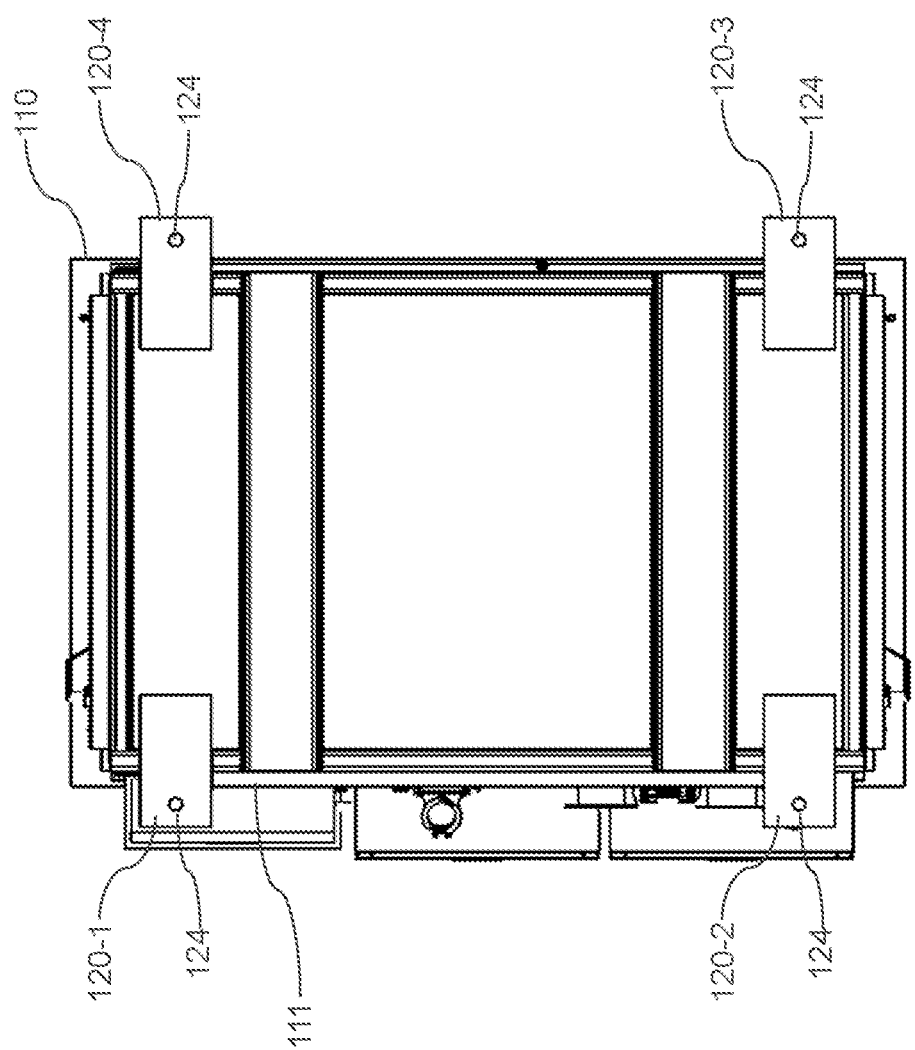
FIG. 2 shows a bottom view of a modular datacenter including a plurality of seismic mounting shims attached thereto in an illustrative embodiment.

Referring to FIGS. 1 and 2, a modular datacenter 110 includes a plurality of seismic mounting shims 120-1, 120-2, 120-3 and 120-4 (collectively "mounting shims 120") attached to the modular datacenter 110. As shown in FIGS. 1 and 2, the mounting shims 120 are attached to a lower portion of a frame 111 of the modular datacenter 110. The locations and number of the mounting shims 120 on the modular datacenter 110 may be varied to accommodate for various manufacturing tolerances of the installation site and/or the electronic equipment. The mounting shims 120 can be located to align with the critical load points of the installed equipment.

Figure 3:
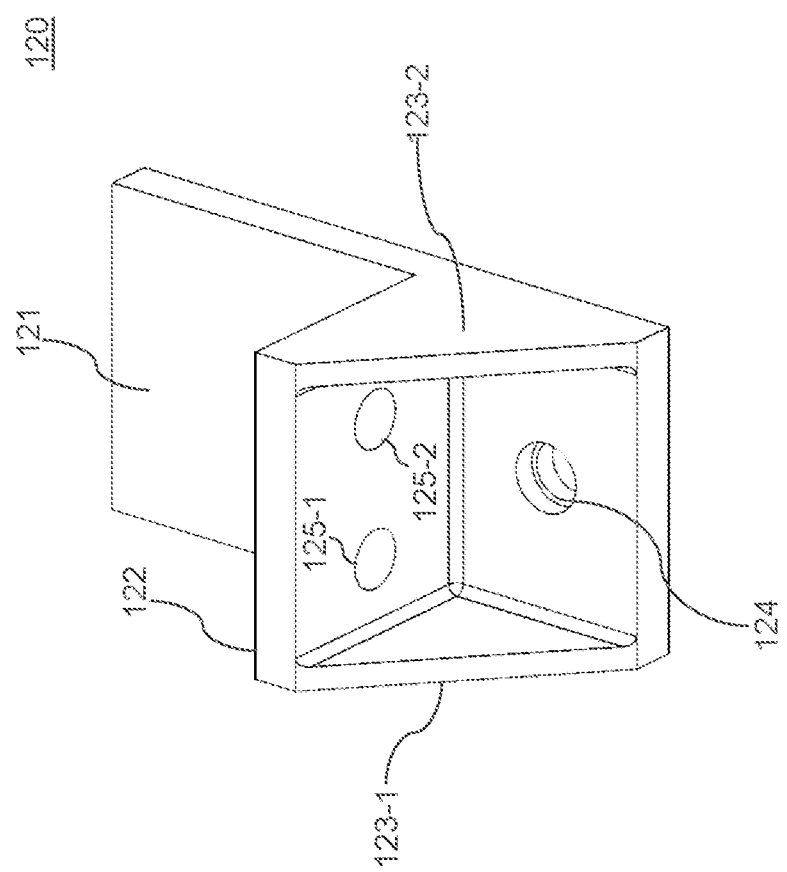
FIG. 3 shows a perspective view of a seismic mounting shim in an illustrative embodiment.
Figure 7:
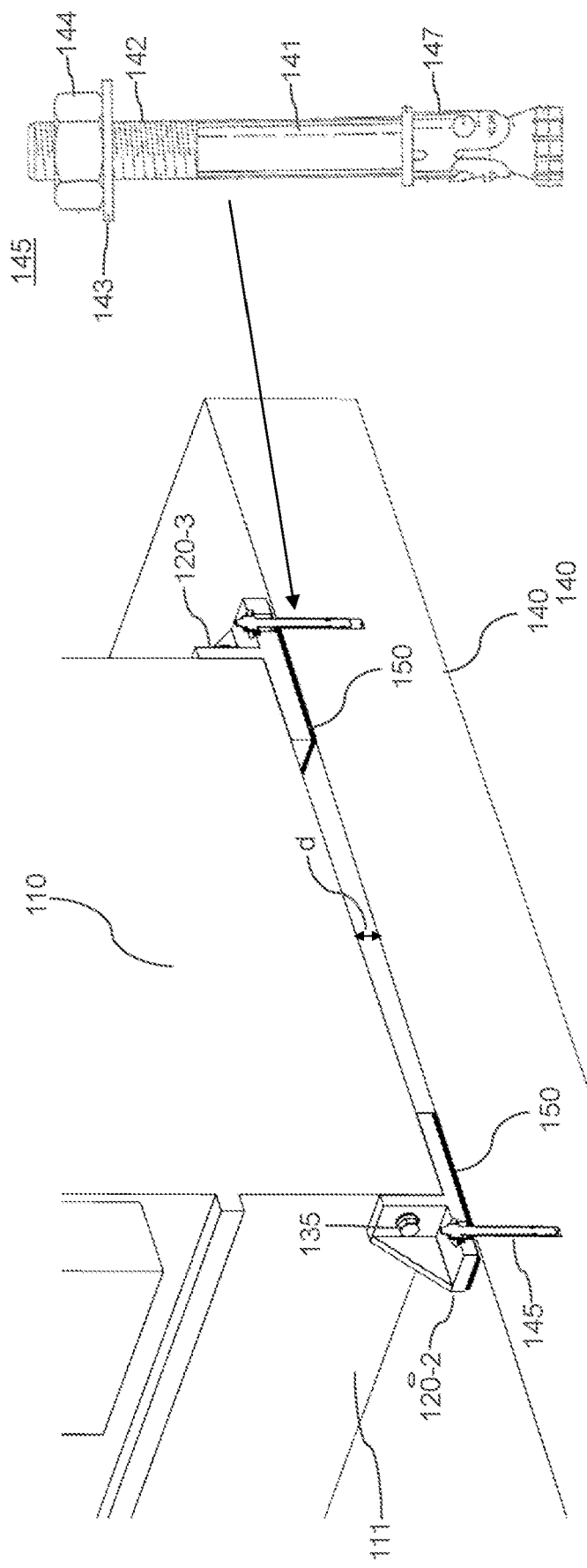
FIG. 7A shows a side cross-sectional view of a modular datacenter installed on a slab via a plurality of seismic mounting shims and leveling shims in an illustrative embodiment.
FIG. 7B shows a close-up view of the hardware used to install the modular datacenter on the slab in FIG. 7A in an illustrative embodiment.

Referring to FIG. 3, a seismic mounting shim 120 comprises a base 121. The base 121 comprises a hole 124 through the base 121. As explained in more detail in connection with FIGS. 7A and 7B, the hole 124 is configured to receive a fastener 145 such as, for example, a fastener to anchor the mounting shim 120 to an underlying floor structure 140. The mounting shim 120 further comprises an extension portion 122 extending from the base 121. The extension portion 122 is perpendicular to the base 121 and comprises two holes 125-1 and 125-2 (collectively "holes 125") through the extension portion 122. As described in more detail in connection with FIG. 4, the holes 125 are configured to receive fasteners 135 used for attaching the mounting shims 120 to the modular datacenter 110. The number of holes 124 and 125 is not limited to what is shown in FIG. 3, and there may be more holes 124, or more or less holes 125. The holes 124 and 125 may be threaded or not threaded.

The mounting shim 120 further comprises a first gusset 123-1 and a second gusset 123-2 (collectively "gussets 123") disposed between the base 121 and the extension portion 122. The first gusset 123-1 is spaced apart from the second gusset 123-2. According to an embodiment, the gussets 123 comprise a triangular shape and are located on a side of the extension portion 122 adjacent the hole 124 for receiving the fastener 145. A side of each of the gussets 123 extends between the extension portion 122 and the base 121 at acute angles with respect to the base 121 and the extension portion 122. In one or more embodiments, the gussets 123 are in the shape of a right triangle where the side that extends between the extension portion 122 and the base 121 is a hypotenuse of the right triangle. The shape, number and location of the gussets 123 may vary according to manufacturing tolerances. In the embodiment in FIG. 3, the holes 125 and 124 are positioned between the gussets 123-1 and 123-2.

Figure 4:
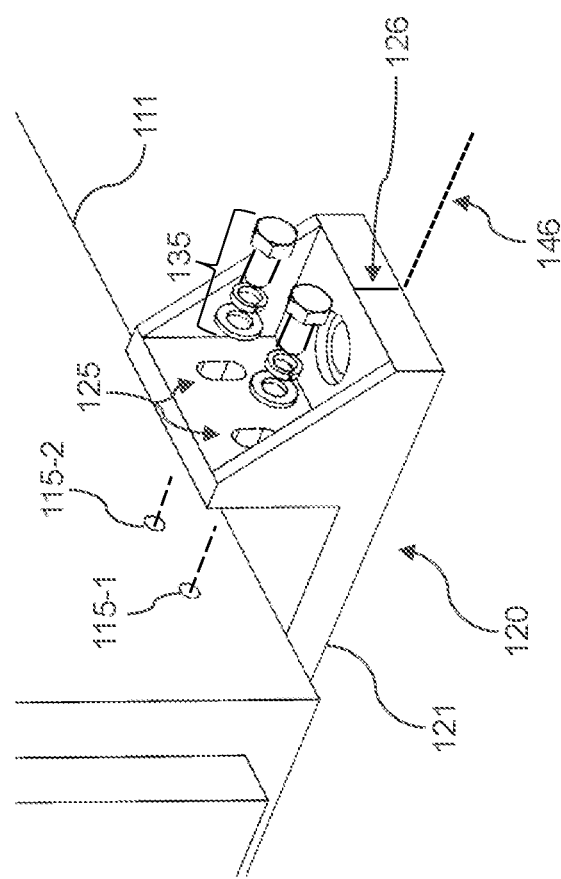
FIG. 4 shows an exploded view depicting attachment of a seismic mounting shim to a modular datacenter in an illustrative embodiment.
Figure 6:
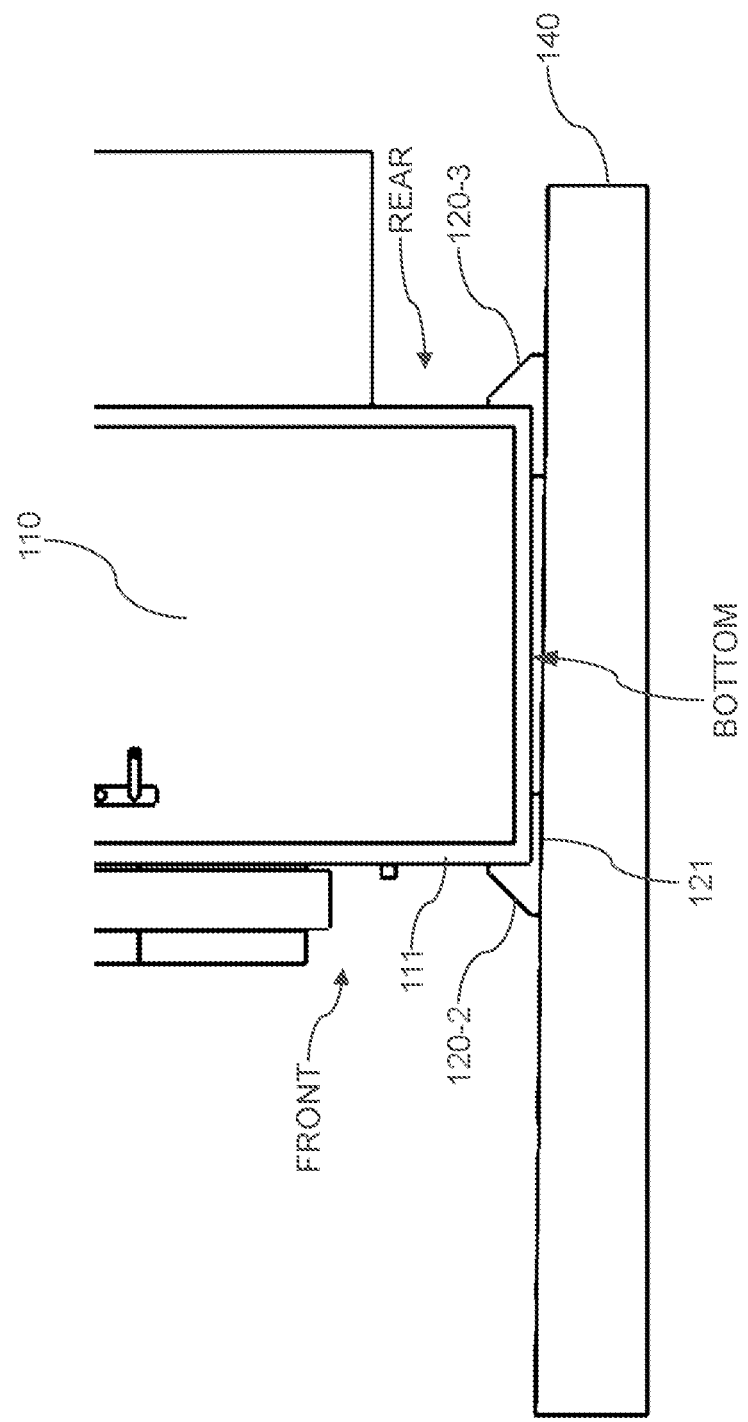
FIG. 6 shows a side view of a modular datacenter installed on a slab via a plurality of seismic mounting shims in an illustrative embodiment.

Referring to FIGS. 6, 7A and 7B, the mounting shims 120 are configured for anchoring to an underlying floor structure 140 via the fasteners 145 inserted through the holes 124. According to one or more embodiments, the underlying floor structure 140 comprises cement and/or concrete (e.g., cement or concrete pad or slab), and the fasteners 145 comprise concrete anchors (e.g., HILTI® concrete anchors). The fastener 145 may include, for example, a shaft 141, threaded portion 142, washer 143, nut 144 and an expansion portion 147, which is disposed in the underlying floor structure 140 and expands outward from the shaft 141 to anchor the fastener 145 in the underlying floor structure 140. The mounting shims 120 are further configured for attachment to a surface of the modular datacenter 110 via the fasteners 135 inserted through the holes 125. Referring to FIG. 4, the fasteners 135 are inserted through the holes 125 into holes 115-1 and 115-2 (collectively "holes 115") in a lower portion of the frame 111 of the modular datacenter 110. According to one or more embodiments, the fasteners 135 comprise screws and/or bolts in combination with nuts, washers and/or lock washers. The holes 115 can be threaded or not threaded. Also shown in FIG. 4, the mounting shims 120 comprise one or more alignment marks 126 on one or more surfaces of the mounting shims 120 configured to align with one or more alignment marks 146 on the underlying floor structure so that an installer knows where to position the modular datacenter 110 on the underlying floor structure 140, thereby enhancing the ease and speed of installation. For example, once a mounting shim 120 is attached on the modular datacenter 110, an alignment mark 126 (positional tick mark) on the surface of the base 121 is aligned with an alignment mark 146 (e.g., chalk line) on the underlying floor structure 140 to position the modular datacenter 110 in the proper location on the underlying floor structure 140.

As shown in FIGS. 4, 6 and 7A, the mounting shims 120 are attached to a front surface and a rear surface of the modular datacenter 110 via the fasteners 135 inserted into holes 115 in the frame 111. A bottom surface of the modular datacenter 110 (e.g., bottom surface of the frame 111) is disposed on part of the base 121 of a mounting shim 120 that is attached to the front surface or the rear surface of the modular datacenter 110. As can be seen in FIGS. 6 and 7A, the part of the bottom surface of the modular datacenter 110 which is not on the bases of the mounting shims 120 is over and spaced apart from the underlying floor structure 140 by a distance d. The distance d is equal to approximately the thickness of the base 121 or approximately the thickness of the base 121 combined with a thickness of a leveling shim 150 if disposed under the base 121.

Figure 5:
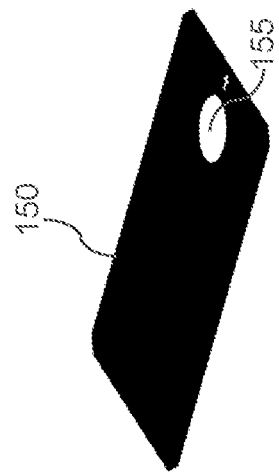
FIG. 5 shows a leveling shim in an illustrative embodiment.

Referring to FIGS. 5 and 7A, the mounting shims 120 are configured for attachment to a leveling shim 150 via the fastener 145 inserted through the hole 124 and a hole 155 in the leveling shim 150, which lines up with the hole 124 to receive the fastener 145. The leveling shim 150 is disposed between a mounting shim 120 and the underlying floor structure 140 and is used to level the modular datacenter 110 when the underlying floor structure 140 is sloped or not level. The underlying floor structure 140 may be sloped for drainage due to, for example, rain, when the modular datacenter 110 is installed outside. Materials of the mounting shims 120, leveling shims 150, fasteners 135 and 145 include, but are not necessarily limited to, stainless steel, aluminum, copper, bronze, brass, galvanized steel or alloys thereof (e.g., 304 and 304L ASTM A240 stainless steel plate, ASTM A551 carbon steel).

According to an embodiment, a method for installing electronic equipment (e.g., a modular datacenter 110) on an underlying floor structure 140 comprises attaching one or more mounting shims 120 to a surface of the modular datacenter, and anchoring the one or more mounting shims 120 to the underlying floor structure 140. Attaching a mounting shim 120 to the surface of the modular datacenter 110 comprises inserting and securing fasteners 135 through the holes 125 and in corresponding holes 115 through the surface of the modular datacenter 110. Anchoring the mounting shim 120 to the underlying floor structure 140 comprises inserting the fastener 145 through the hole 124 and into a corresponding hole in the underlying floor structure 140. The fasteners 135 and 145 are oriented perpendicular with respect to each other. In the method, one or more alignment marks (e.g., alignment mark 126) on one or more surfaces of a mounting shim 120 are aligned with one or more alignment marks (e.g., alignment mark 146) on the underlying floor structure 140. In the method, a leveling shim 150 is disposed between one or more mounting shims 120 of a plurality of mounting shims 120 and the underlying floor structure 140. In order to level the modular datacenter 110 on a sloped underlying floor structure 140, some mounting shims 120 attached to a modular datacenter 110 may not have a leveling shim 150 disposed thereunder, or may have more than one leveling shim 150 disposed thereunder, while other mounting shims 120 have one leveling shim 150 disposed thereunder.

In one or more embodiments, an electronic equipment chassis comprises a frame (e.g., frame 111) having a front portion and a rear portion. Referring to FIGS. 1, 2, 4, 6 and 7A, a plurality of mounting shims 120 are attached to the front and rear portions of the frame 111. The plurality of mounting shims 120 are attached to the front and rear portions of the frame via respective corresponding ones of the fasteners 135 inserted through respective corresponding ones of the holes 125. The plurality of mounting shims 120 are configured for anchoring to an underlying floor structure 140 via respective corresponding ones of the fasteners 145 inserted through respective corresponding ones of the holes 124. The frame 111 includes a bottom portion disposed on parts of the bases 121 (e.g., portions of the bases 121 not including the holes 124) of the respective ones of the plurality of mounting shims 120.

Figure 8:
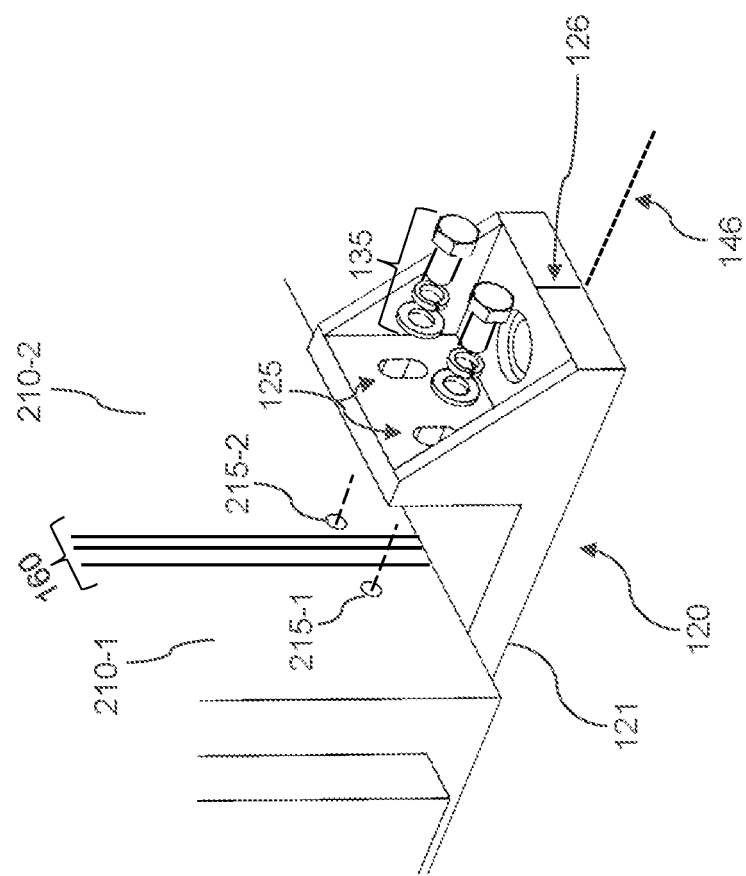
FIG. 8 shows an exploded view depicting attachment of a seismic mounting shim to a plurality of modular datacenters in an illustrative embodiment.

Referring to FIG. 8, a mounting shim 120 may be attached to surfaces of more than one modular datacenter, for example, two modular datacenters 210-1 and 210-2 (collectively "modular datacenters 210") so that a single mounting shim 120 supports multiple datacenters. In this case, the size of the mounting shim 120, as well as the number of holes 124, 125 and corresponding fasteners 135, 145 can be increased to accommodate and support more than one modular datacenter. While two modular datacenters 210 are shown on the mounting shim 120 in FIG. 8, the embodiments are not necessarily limited thereto, and more than two modular datacenters or other types electronic equipment configurations can be disposed on a mounting shim 120. Similar to the configuration in FIG. 4, the mounting shim 120 is attached to the modular datacenters 210 via the fasteners 135 inserted through the holes 125. The fasteners 135 are further inserted through the holes 125 into holes 215-1 and 215-2 (collectively "holes 215") in lower portions of respective ones of the modular datacenters 210-1 and 210-2. Similar to the holes 115, the holes 215 can be threaded or not threaded. A portion of the bottom surface of each of the modular datacenters 210-1 and 210-2 rests on the base 121 of the mounting shim 120. In addition, weather seal material 160 is positioned on the base 121 and between the modular datacenters 210-1 and 210-2 to ensure sealing of the modular datacenters 210 from different types of weather conditions, such as rain or snow. Similar to the configuration with one modular datacenter 110 on a mounting shim 120, one or more leveling shims 150 can be disposed under the mounting shim 120 supporting the modular datacenters 210 in order to level the modular datacenters 210 on a sloped underlying floor structure 140. The weather seal material 160 comprises, for example, water or moisture resistant material such as, for example, silicone, polyurethane, rubber, polyvinyl chloride (PVC), etc.

Modular datacenters (e.g., modular datacenter 110) require seismic anchoring concrete and/or cement installation slabs (e.g., underlying floor structure 140) in many United States jurisdictions. These underlying floor structures 140 are sometimes sloped to accommodate for site drainage; however, the modular datacenter 110 must be installed level. The embodiments advantageously combine both shimming and seismic anchoring capabilities. Additionally, conventional installation methods for modular datacenter deployments require expensive onsite welders, undesirably long labor times and possibly poor weld quality.

The embodiments advantageously provide a mounting solution that satisfies seismic anchoring and datacenter leveling installation requirements. The embodiments utilize a fastener based solution, that is both time-efficient and cost-effective. Additionally, the number of mounting shims can be varied from site to site such that each installation is cost-optimized for the site's International Building Code (IBC) seismic level. At least some embodiments are in compliance with IBC seismic and wind restraining requirements, as described in, for example, the American Society of Civil Engineers (ASCE) 7-10 Minimum Design Loads for Building and Other Structures (2019) and American Welding Society (AWS) D1.1 Structural Welding Code—Steel (2019), which are incorporated by reference herein. The embodiments provide a certified seismic and wind restraining design solution which enhances cost optimization by providing for selective use of mounting and leveling shims, where the number and size of mounting and leveling shims can be varied, and used for different types of electronic equipment installations at, for example, the rack level and the module level.

The arrangements shown in the illustrative embodiments of FIGS. 1 through 8 are presented by way of example for purposes of illustration only, and alternative embodiments can utilize a wide variety of other types of mounting shims, leveling shims, modular datacenters, etc. Accordingly, the particular configurations of components as shown in the figures can be varied in other embodiments. Moreover, the various assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A mounting device for electronic equipment comprising:
   a base, the base comprising at least a first hole through the base, wherein the first hole is configured to receive a first fastener;
   an extension portion extending from the base, wherein the extension portion is perpendicular to the base and comprises at least a second hole through the extension portion, wherein the second hole is configured to receive a second fastener;
   a first gusset disposed between the base and the extension portion; and
   a second gusset disposed between the base and the extension portion and spaced apart from the first gusset;
   wherein the mounting device is configured for anchoring to an underlying floor structure via the first fastener inserted through the first hole;
   wherein the mounting device is configured for attachment to a surface of the electronic equipment via the second fastener inserted through the second hole; and
   wherein the mounting device is configured for attachment to a leveling shim via the first fastener inserted through the first hole.

2. The mounting device of claim 1 further comprising one or more alignment marks on one or more surfaces of the mounting device configured to align with one or more alignment marks on the underlying floor structure.

3. The mounting device of claim 1 wherein the underlying floor structure comprises at least one of cement and concrete, and the first fastener comprises a concrete anchor.

4. The mounting device of claim 1 wherein the mounting device is configured for attachment to one of a front surface and a rear surface of the electronic equipment via the second fastener, wherein a bottom surface of the electronic equipment is disposed on part of the base when the mounting device is attached to one of the front surface and the rear surface of the electronic equipment.

5. The mounting device of claim 1 wherein the leveling shim is disposed between the mounting device and the underlying floor structure.

6. The mounting device of claim 1 wherein:
   the extension portion further comprises at least a third hole through the extension portion, wherein the third hole is configured to receive a third fastener; and
   the mounting device is configured for attachment to a surface of additional electronic equipment via the third fastener inserted through the third hole.

7. The mounting device of claim 1 wherein the second hole is positioned in the extension portion between the first and second gussets.

8. The mounting device of claim 1 wherein the first hole is positioned in the base between the first and second gussets.

9. The mounting device of claim 1 wherein the mounting device is configured for attachment to one of a front surface and a rear surface of an electronic equipment rack of a modular datacenter via the second fastener.

10. A method comprising:
    attaching a mounting device to a surface of electronic equipment, the mounting device comprising a base and an extension portion extending perpendicularly from the base;

anchoring the mounting device to an underlying floor structure;

wherein the base comprises at least a first hole through the base configured to receive a first fastener, and the extension portion comprises at least a second hole through the extension portion configured to receive a second fastener;

wherein attaching the mounting device to the surface of the electronic equipment comprises inserting the second fastener through the second hole and into a corresponding hole in the surface of the electronic equipment;

wherein anchoring the mounting device to the underlying floor structure comprises inserting the first fastener through the first hole and into a corresponding hole in the underlying floor structure; and wherein the first and second fasteners are oriented perpendicular with respect to each other; and attaching the mounting device to a leveling by inserting the first fastener through the first hole and through a hole in the leveling into the corresponding hole in the underlying floor structure.

11. The method of claim 10 further comprising aligning one or more alignment marks on one or more surfaces of the mounting device with one or more alignment marks on the underlying floor structure.

12. The method of claim 10 wherein attaching the mounting device to the surface of the electronic equipment further comprises:

attaching the mounting device to one of a front surface and a rear surface of the electronic equipment via the second fastener; and disposing a bottom surface of the electronic equipment on part of the base.

13. The method of claim 10 wherein attaching the mounting device to the leveling comprises disposing the leveling between the mounting device and the underlying floor structure.

14. The method of claim 13 wherein the underlying floor structure is sloped.

15. The method of claim 10 wherein attaching the mounting device to the surface of the electronic equipment comprises attaching the mounting device to an electronic equipment rack of a modular datacenter.

16. The method of claim 10 wherein:

the extension portion further comprises at least a third hole through the extension portion, wherein the third hole is configured to receive a third fastener; and the mounting device is configured for attachment to a surface of additional electronic equipment via the third fastener inserted through the third hole.

17. An electronic equipment chassis comprising:

a frame having a front portion and a rear portion; and a plurality of mounting devices attached to the front and rear portions of the frame, respective ones of the plurality of mounting devices comprising:

a base, the base comprising at least a first hole through the base, wherein the first hole is configured to receive a first fastener; and an extension portion extending from the base, wherein the extension portion is perpendicular to the base and comprises at least a second hole through the extension portion, wherein the second hole is configured to receive a second fastener;

wherein the plurality of mounting devices are attached to the front and rear portions of the frame via respective corresponding ones of the second fasteners inserted through respective corresponding ones of the second holes;

wherein the plurality of mounting devices are configured for anchoring to an underlying floor structure via respective corresponding ones of the first fasteners inserted through respective corresponding ones of the first holes; and wherein the respective ones of the plurality of mounting devices are configured for attachment to respective ones of a plurality of leveling shims via the respective corresponding ones of the first fasteners inserted through the respective corresponding ones of the first holes.

18. The electronic equipment chassis of claim 17 wherein the respective ones of the plurality of mounting devices further comprise:

a first gusset disposed between the base and the extension portion; and a second gusset disposed between the base and the extension portion and spaced apart from the first gusset.

19. The electronic equipment chassis of claim 17 wherein the frame includes a bottom portion disposed on parts of the bases of the respective ones of the plurality of mounting devices.

20. The electronic equipment chassis of claim 17 wherein the respective ones of the plurality of leveling shims are disposed between the respective ones of the plurality of mounting devices and the underlying floor structure.

* * * * *

UNITED STATES PATENT AND TRADEMARK OFFICE
CERTIFICATE OF CORRECTION

PATENT NO. : 11,659,681 B2
APPLICATION NO. : 17/505792
DATED : May 23, 2023
INVENTOR(S) : Luis Alejandro Ruiz Holguin et al.

It is certified that error appears in the above-identified patent and that said Letters Patent is hereby corrected as shown below:

In the Claims

Claim 10, Column 7, Line 19, please delete "attaching the mounting device to a leveling by inserting" and insert therefor --attaching the mounting device to a leveling shim by inserting--

Claim 10, Column 7, Line 21, please delete "hole in the leveling into the corresponding hole in the" and insert therefor --hole in the leveling shim into the corresponding hole in the--

Signed and Sealed this
Twenty-seventh Day of June, 2023

Katherine Kelly Vidal
*Director of the United States Patent and Trademark Office*